United States Patent
Ordentlich et al.

(10) Patent No.: US 6,175,317 B1
(45) Date of Patent: Jan. 16, 2001

(54) TWO-DIMENSIONAL DC-FREE ENCODER AND DECODER

(75) Inventors: Erik Ordentlich, Palo Alto, CA (US); Ron M. Roth, Ramat Gan (IL)

(73) Assignee: Hewlett-Packard Company, Palo Alto, CA (US)

( * ) Notice: Under 35 U.S.C. 154(b), the term of this patent shall be extended for 0 days.

(21) Appl. No.: 09/360,855

(22) Filed: Jul. 24, 1999

(51) Int. Cl.[7] .............................. H03M 5/00; H03M 13/00
(52) U.S. Cl. ................................................. 341/58; 341/94
(58) Field of Search .................................. 341/94, 58, 87

(56) References Cited

U.S. PATENT DOCUMENTS 5,450,440 * 9/1995 Siegel et al. ........................ 375/286
5,929,794 * 7/1999 Hayakawa et al. ..................... 341/87

OTHER PUBLICATIONS

Ronald M. Roth et al., "Efficient code construction for certain two-dimensional constraints", Proc. IEEE Int'l Symp. Inform. Theory, Ulm, Germany (Jun. 1999), p. 387.

Kees A. Schouhamer Immink, "A practical method for approaching the channel capacity of constrained chanels", IEEE Transactions on Information Theory, vol. 43, No. 5, Sep. 1997.

* cited by examiner

Primary Examiner—Michael Tokar
Assistant Examiner—James H. Cho (57) ABSTRACT

A message is encoded into an array, which is an element of a constrained array set. The message is encoded by considering candidates for each entry (e.g., column, bit) of the array. The candidates have a predetermined ordering. For each candidate that is considered, a lower bound is determined. The lower bound indicates a number of set elements including both the candidate being considered and previously selected candidates of the array. An entry is filled with a candidate based upon the value of the lower bound relative to an intermediate message. The intermediate message is initially equal to the message being encoded, and is updated after each column of the array has been filled.

44 Claims, 6 Drawing Sheets

TWO-DIMENSIONAL DC-FREE ENCODER AND DECODER

BACKGROUND OF THE INVENTION

The invention relates to data storage. More specifically, the invention relates to modulation encoding of data prior to storage on a recordable medium.

In magnetic and optical memory devices, sectors of user data are typically encoded prior to storage on recordable media. The sectors are arranged into blocks, and the blocks of user data are encoded for forward error correction. Redundancy data such as error correction codewords are added to the user data, thereby forming Error Correction Codeword ("ECC") blocks. The redundancy data allows for forward error correction of user data that, after retrieval, has been found to contain errors (for example, due to an error on the storage medium).

The ECC blocks are then modulation encoded. During modulation encoding, slices of bits (hereinafter referred to as "messages") of the blocks are mapped into distinct symbols. For instance, 8-bit messages might be mapped into distinct 16-bit symbols or codewords. One popular modulation code is a "(2,10)-Run Length Limited" code.

Blocks of these codewords are then written to a storage medium. In the case of a hard drive, the codewords are typically arranged on a platter in concentric tracks. In the case of an optical disc such as a CD or DVD, the data is stored in a spiral groove in a substrate (and perhaps on lands too). In both cases, the data storage is one-dimensional.

Recent proposals for the design of optical storage-in particular holographic memory design-have attempted to take advantage of the fact that the recording surface of the media is actually two-dimensional. Storing data in two dimensions instead of one dimension would allow recording density to be increased.

Adding the additional dimension to encoding, however, introduces new types of constraints on the recorded data. Experiments reported on holographic memory, and experience gathered in other existing optical devices, suggest that the number of 0's and 1's in the recorded data should be balanced within certain areas or patterns. If data is recorded in two-dimensional n×m rectangular arrays (that is, arrays having n rows and m columns), one constraint of potential interest requires that every row and column of the recorded array be balanced. A row or column or, more generally, a vector having 0,1 entries is balanced if it has the same number of 0's and 1's. Such arrays shall be referred to as balanced arrays. Thus, the problem becomes one of encoding unconstrained (binary) messages into distinct n×m balanced arrays of recorded data.

Lowering the redundancy of the encoding algorithm makes it more efficient since it can represent a greater number of messages using a given array size, and hence a given area on the storage medium. A two-dimensional encoding algorithm for balanced arrays has been proposed in a paper by R. Talyansky, T. Etzion and R. M. Roth in "Efficient code constructions for certain two-dimensional constraints," IEEE Trans. Inform. Theory, 45 (1999), pp. 794–99.

An encoding algorithm that achieves a smaller redundancy would be desirable. Reducing the redundancy would allow a greater number of messages to be packed into n×m balanced arrays. This, in turn, would allow more data to be placed on the tracks. Reducing the redundancy would also allow tracks to be spaced closer together. Thus, reducing the redundancy in two dimensions would allow storage density to be increased.

SUMMARY OF THE INVENTION

A message is encoded into a corresponding constrained array, which is an element of a set of distinct constrained arrays. A column-wise method of encoding a message into a corresponding array of the constrained array set may be performed by (a) considering a predetermined ordering of candidates for a $j^{th}$ column of the corresponding array, where j is a positive integer; (b) for each candidate being considered, computing a lower bound on the number of constrained arrays having that candidate as the $j^{th}$ column and any previously selected columns of the corresponding array as the first j-1 columns; (c) determining an index range for each candidate being considered, upper and lower limits of each index range being based upon the lower bounds of the candidates being considered; (d) determining the range in which an intermediate message lies; and (e) selecting the candidate corresponding to the determined range as the $j^{th}$ column of the corresponding array.

In the alternative, a bit-wise method of encoding a message into a corresponding array of the constrained array set may be performed by (a) determining a lower bound on the number of constrained arrays with a 0 as the $k^{th}$ bit of the $j^{th}$ column and the first k-1 bits of the $j^{th}$ column and first j-1 columns being equal to previously selected entries of the corresponding array; and (b) setting the value of the $k^{th}$ bit of the corresponding array depending upon the value of the lower bound relative to an intermediate message. Steps (a) and (b) are performed for each bit in the corresponding array.

Such encoding of messages into constrained arrays achieves a lower redundancy than encoding according to the algorithm mentioned above in the Roth et al. paper. The reduction of redundancy allows storage density to be increased.

Other aspects and advantages of the present invention will become apparent from the following detailed description, taken in conjunction with the accompanying drawings, illustrating by way of example the principles of the invention.

DETAILED DESCRIPTION OF THE INVENTION

As shown in the drawings for purposes of illustration, the present invention is embodied in a drive that can write data to a recordable medium. The drive can perform two-dimensional modulation-encoding, in which messages are encoded into distinct n×m arrays. The n×m arrays are balanced, and therefore dc free when 0's and 1's are mapped to equal magnitude signals with opposite polarity. Moreover, redundancy of the encoding is lower than previously reported. As a consequence of reducing the redundancy, a greater number of messages can be packed into n×m arrays. This, in turn, allows more information to be stored on the medium. Reducing the redundancy of the encoding allows storage density to be increased.

Figure 1:
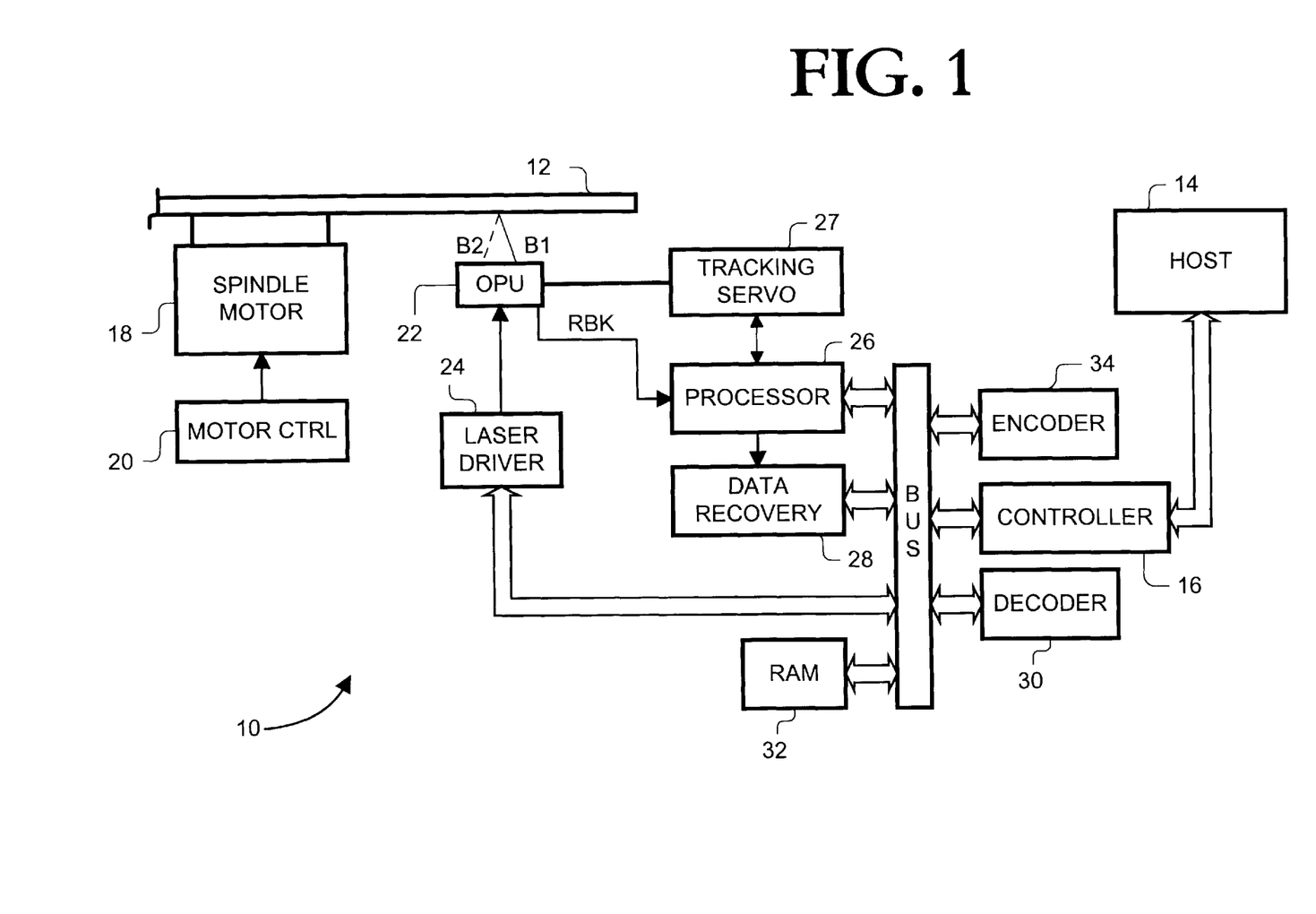
FIG. 1 is an illustration of a read/write device that performs two-dimensional encoding in accordance with the present invention.

FIG. 1 shows a drive 10 for writing data to an optical disc 12. The drive 10 includes a controller 16 for receiving a mode of operation from a host 14 (e.g., a personal computer). Typical modes of operation include a read mode and may include various write modes such as a write-append mode and an insert-edit mode.

The drive 10 further includes a spindle motor 18 and motor control 20 for rotating the disc 12. The drive 10 further includes an optical pickup unit 22, which typically includes a laser for generating a laser beam B1; and means (e.g., an optics assembly and photodetector array) for detecting a modulated beam B2. The optical pickup unit 22 generates a readback signal RBK carrying data and timing/addressing information.

The laser of the optical pickup unit 22 is driven by a laser driver 24. Power of the laser beam B1 depends upon the mode of operation of the drive 10. The laser power is controlled between various levels including a read level for reading data from the disc 12, an erase level for erasing data on the disc 12, and a write level for writing data to the disc 12. A processor 26 receives the readback signal RBK from the optical pickup unit 22.

A tracking servo 27 receives the readback signal RBK from the processor 26. The tracking servo 27 moves the optical pickup unit 22 along the disc 12.

During read mode, a conventional data recovery circuit 28 receives an electrical signal from the processor 26 and recovers data from the electrical signal. A decoder 30 demodulates the recovered data, arranges the demodulated data into ECC blocks in RAM 32, and performs error correction on the ECC blocks. Error-corrected user data is sent to the host 14.

During a write mode, user data is sent by the host 14 to the controller 16, which buffers the user data in RAM. Under control of the controller 16, an encoder 34 adds redundancy data to the user data and then performs two-dimensional modulation encoding on the ECC blocks. During the modulation encoding, a plurality of messages (e.g., bit slices) are obtained from the ECC blocks and the messages are encoded into constrained arrays. The constrained arrays may be balanced.

The controller 16 has the encoder 34 send the modulation-encoded data to the laser driver 24, and it commands the laser driver 24 to begin writing the data to the disc 12 (e.g., the controller 16 enables a write clock generator to send a write clock to the laser driver 24). The laser driver 24 causes the laser in an optical pickup unit 22 to write the data to the disc 12.

Figure 2:
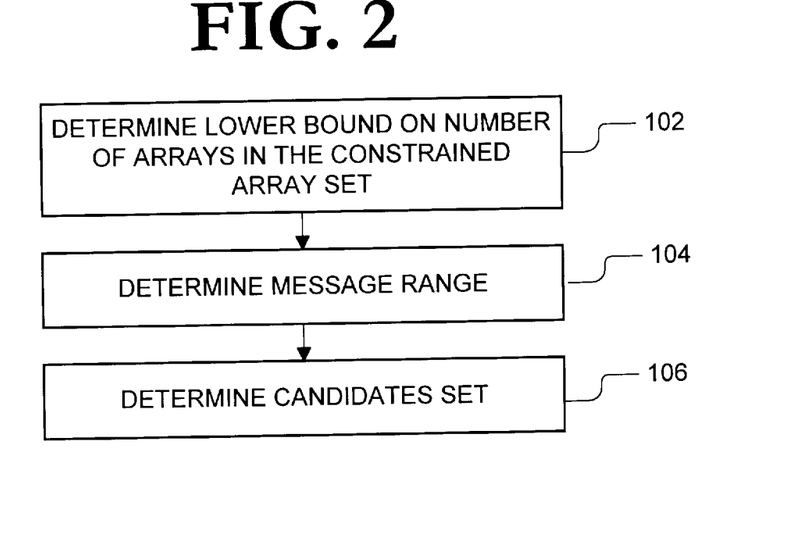
FIG. 2 is a flowchart of a method of performing initialization steps for the two dimensional encoding in accordance with the present invention.
Figure 3:
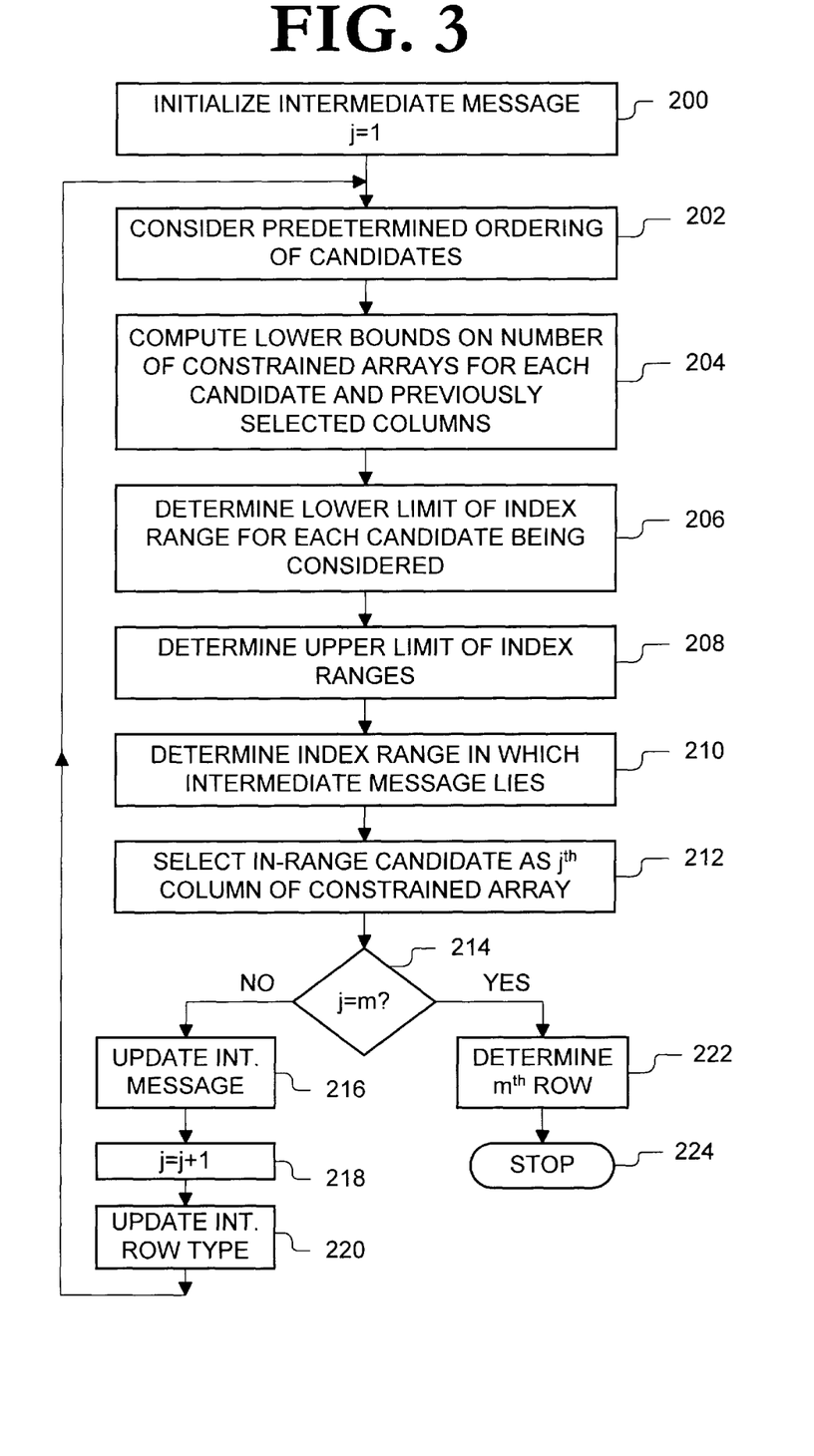
FIG. 3 is a flowchart of a column-wise method for encoding a message into an n×m balanced array in accordance with the present invention.

FIGS. 2 and 3 illustrate a method of performing the two-dimensional encoding of messages that are members of the message set U. Each message u in the set U is encoded into a corresponding n×m balanced array E(u) belonging to the balanced array set C. The encoding method will first be described in terms of a column selection procedure given integers n and m and a message u.

FIG. 2 illustrates initialization steps that are performed prior to the encoding. First, a lower bound on the number of arrays in the balanced array set C is determined (block 102). Let the row type of a binary array be the integer n-vector with entries specifying the number of 1's in the corresponding rows of the array. Thus, if the row type of an array is the integer n-vector $w=(w_1, \ldots, w_n)$, then the $i^{th}$ row has $w_i$ 1's for $i=1\ldots n$. For example, an array having row type $w=(4, 4, \ldots, 4)$ will have four 1's in the first row, four 1's in the second row and four 1's in the $n^{th}$ row.

Now let $R_m(w)$ be the set of all binary n×m arrays having rows of type vector w. The cardinality of $R_m(w)$, denoted by $|R_m(w)|$ is given by equation (1).

$$|R_m(w)| = \prod_{i=1}^{n} \binom{m}{w_i} \quad (1)$$

For even values of n and an integer n-vector w with components summing to nm/2, let $M_m(w)$ denote the set of all arrays in $R_m(w)$ having balanced columns (n/2 1's and n/2 0's in every column). For even m, the set C of balanced n×m arrays is equivalent to the constraint set $M_m(w)$ with $w=(m/2, \ldots, m/2)$. Thus, an encoder mapping messages u into balanced arrays E(u) is obtained as a special case of an encoder that maps messages u into arrays belonging to the set $M_m(w)$. This more general encoder is described next.

First a lower bound on the number of arrays satisfying the constraints, in this case the number of arrays in the set $M_m(w)$, is computed. A lower bound on the cardinality of $M_m(w)$, denoted by $|M_m(w)|$, is given by the formula $(\lambda_n)^m |R_m(w)|$, where $\lambda_n$ may be determined according to equation (2).

$$\lambda_n = \frac{\binom{n}{n/2}}{2^n} \quad (2)$$

Next, the message range is determined (block 104). The message range may be determined according to equation (3).

$$0 \leq u < (\lambda_n)^m |R_m(w)| \quad (3)$$

Thus, the number of distinct messages u in the message set U must be at most $(\lambda_n)^m |R_m(w)|$, the determined lower bound on the cardinality of the set of constrained arrays $M_m(w)$. If the message u is a binary word, the length of the message u may be the integer portion of $\log_2((\lambda_n)^m |R_m(w)|)$.

The set V of column candidates may also be determined during initialization (block 106). For the constraint set $M_m(w)$, the candidates set V consists of all of the balanced n dimensional binary vectors. When n=4, for example, the candidates set V for consideration consists of (0,0,1,1), (0,1,0,1), (0,1,1,0), (1,0,0,1), (1,0,1,0) and (1,1,0,0).

Reference is now made to FIG. 3, which shows the encoding method according to the present invention. At the start of encoding (block 200), a message u is supplied to the encoder 34. The message u may be an integer within the range computed in the initialization step. Thus, the message may be a binary string, which, for encoding purposes, can be interpreted as an integer in binary notation.

The n×m balanced array E(u) into which the message u is mapped is determined one column at a time according to an iterative procedure. Each step of the iterative procedure determines a new column of E(u) based on the above formulas and the values of two intermediate state variables: an intermediate message u' and intermediate row type w'. These intermediate state variables u' and w' are updated after each iteration in preparation for determining the next column. The intermediate message u' holds an updated message and is initialized to u'=u, the message being encoded. The intermediate row type w' holds the row type of the yet-to-be determined portion of the constrained array E(u) and is initialized to w'=w, the initial row type defining the constraint. Assume j−1 columns $e_1$ to $e_{j-1}$ of the balanced array E(u) have already been selected. The $j^{th}$ column is determined as follows. A predetermined ordering of candidates in the set V for the $j^{th}$ column is considered (block 202). For each candidate y being considered in the candidates set V, a lower bound on the number of constrained arrays in the set $M_m(w)$ having that candidate y as the $j^{th}$ column and the previously selected j−1 columns $e_1, \ldots, e_{j-1}$ is computed (block 204). In the case of arrays belonging to $M_m(w)$, this lower bound is given by $$\lambda_n^{m-j} |R_{m-j}(w'-y)| \quad (4)$$

where w' is the row type of the n×(m−j+1) yet-to-be selected portion of the balanced array E(u) (as implied by the starting row type w and the previously selected columns $e_1, \ldots, e_{j-1}$). If the candidate y is the first column of the n×(m−j+1) portion of the array E(u) that has yet-to-be selected, then w'−y is the row type of the remaining n×(m−j) portion of the array E(u).

Next, a lower limit $\sigma_L(y)$ of the index range is determined for each candidate y being considered (block 206). The lower limit $\sigma_L(y)$ may be determined by equation (5):

$$\sigma_L(y) = \lambda_n^{m-j} \sum_{v<y} |R_{m-j}(w'-v)| \quad (5)$$

where the sum is over all balanced binary vectors v appearing before y in the ordering. Thus, equation (5) provides a lower bound on the number of arrays in $M_m(w)$ starting with the previously selected columns $e_1 \ldots e_{j-1}$ and having a $j^{th}$ column that appears before y in the predetermined ordering.

The upper limit $\sigma_L(y)$ of the index range corresponding to candidate y is equal to the lower limit corresponding to the candidate y plus the lower bound of the candidate (block 208). The upper limit $\sigma_L(y)$, for all but the maximal y, is equal to the lower limit of the candidate immediately following candidate y in the ordering. There will be one or more non-zero values for $\sigma_u(y)$.

Next, the range in which the intermediate message u' lies is determined (block 210). The candidate y satisfying $\sigma_u(y) \leq u' < \sigma_U(y)$ is selected as the $j^{th}$ column $e_j$ of the corresponding balanced array E(u) (block 212). This is equivalent to determining the largest candidate y, in terms of the predetermined ordering, which satisfies $\sigma_L(y) \leq u'$.

If j<m (block 214), then additional columns $e_{j+1}$ to $e_m$ for the balanced array E(u) are selected. Therefore, the intermediate message u' is updated by subtracting from it the smallest integer that is greater than or equal to the lower limit of the range of the selected candidate $e_j$ (that is, u'=u'−⌈$\sigma_L(e_j)$⌉) (block 216); the column index j is incremented to j+1 (block 218); the intermediate row type w' is updated to w'=w'−$e_j$ (block 220); and control is returned to the first block (block 202).

When updating the intermediate message u', its new value is the integer portion of u'−$\sigma_L(e_j)$, which is denoted by int(u'−$\sigma_L(e_j)$). In the alternative, the intermediate message u' may be updated simply according to u'=u'−$\sigma_L(e_j)$ so that in future iterations u' might not necessarily be an integer. The above steps still apply, but a different encoding may result.

If j=m (block 214), w' becomes the last column $e_m$ of the balanced array E(u) (block 222), whereby the modulation encoding is finished (block 224).

A simple example of this column-wise two-dimensional modulation encoding will now be provided. The example will be described in connection with a 4×4 balanced array encoder, which encodes a set U of messages into a set C of balanced 4×4 arrays. Thus, n=4 and m=4. The row type and column type of the arrays in the set C are equal to w=(2,2,2,2).

Before the encoding begins, the initialization steps are performed to establish the message range. Applying equation (1):

$$R_4(2,2,2,2) = \binom{4}{2}\binom{4}{2}\binom{4}{2}\binom{4}{2} = \frac{(4)(3)(2)(1)}{(2)(1)(2)(1)}(6)(6)(6) = 6^4$$

Thus, there are $R_4=6^4$ ways of putting two 1's in each row of a 4×4 array.

Applying equation (2):

$$\lambda_4 = \frac{\binom{4}{2}}{2^4} = \frac{6}{16} = \frac{3}{8}$$

The number $\lambda_4$ is the probability that two out of four randomly selected binary elements (each taking the value one with probability ½) are equal to one.

Applying equation (3), $$0 \leq u < \left(\frac{3}{8}\right)^4 (6^4) \text{ or } 0 \leq u < 25.6$$

Thus, the message range is between 0 and 25.6.

Since a 5-bit word can take on thirty two ($2^5$) values, and since, from the above range, the 4×4 balanced array encoder can handle only up to 25 messages, the length of each message u in the message set U is restricted to four bits. Therefore, only sixteen balanced arrays would be needed to cover the sixteen possible values of a four-bit message u. Accordingly, the controller 16 would be configured to send four-bit slices of the ECC-encoded blocks to the encoder 34, and the encoder 34 would be configured to encode each four-bit message u into a corresponding one of sixteen balanced arrays E(u) in the balanced array set C.

There are six ways of putting two ones into a single column of a 4×4 balanced array. Therefore, a set V of six candidates in which 1's and 0's are balanced will be considered for each column of the balanced array E(u). The six candidates appearing in the predetermined order to be used in the encoding are $v^{(1)}=(0,0,1,1)$; $v^{(2)}=(0,1,0,1)$; $v^{(3)}=(0,1,1,0)$; $v^{(4)}=(1,0,0,1)$; $v^{(5)}=(1,0,1,0)$; and $v^{(6)}=(1,1,0,0)$. This ordering corresponds to a lexicographic ordering in which $v^{(i)}<v^{(j)}$ if and only if $v^{(i)}$ is 0 and $v^{(j)}$ is 1 in the first position from the left in which they differ.

The encoding of a message u=10 (that is, $1010_2$) is performed as follows. A first iteration (j=1) is performed, where w'=w=(2,2,2,2) and u'=u=10. The first candidate $y=v^{(1)}=(0,0,1,1)$ is considered (see Table 1). This establishes the lower limit on the index range for the first candidate $v^{(1)}=(0,0,1,1)$.

TABLE 1

| y | w' | w' − y | $R_3(w' - y)$ | $\sum_{v<y}\|R_3(w'-v)\|$ | $\lambda_4^3 \sum_{v<y}\|R_3(w'-v)\|$ |
|---|----|--------|---------------|---------------------------|----------------------------------------|
| 0 | 2  | 2      | $\binom{3}{2}\binom{3}{2}\binom{3}{1}\binom{3}{1} = 81$ | 0 | $(3/8)^3(0) = 0$ |
| 0 | 2  | 2      |               |   |   |
| 1 | 2  | 1      |               |   |   |
| 1 | 2  | 1      |               |   |   |

The second candidate $v^{(2)}=(0,1,0,1)$ is then considered (see Table 2).

TABLE 2

| y | w | w' − y | $R_3(w' - y)$ | $\sum_{v<y}\|R_3(w'-v)\|$ | $\lambda_4^3 \sum_{v<y}\|R_3(w'-v)\|$ |
|---|---|--------|---------------|---------------------------|----------------------------------------|
| 0 | 2 | 2      | $\binom{3}{2}\binom{3}{1}\binom{3}{2}\binom{3}{1} = 81$ | 81 | $(3/8)^3(81) = 4.3$ |
| 1 | 2 | 1      |               |    |    |
| 0 | 2 | 2      |               |    |    |
| 1 | 2 | 1      |               |    |    |

Therefore, the index range of the first candidate $v^{(1)}$ is [0,4.3). Additionally, the lower limit on the index range of the second candidate $v^{(2)}$ is 4.3.

The third candidate $v^{(3)}=(0,1,1,0)$ is then considered as shown in Table 3.

TABLE 3

| y | w' | w' − y | $R_3(w' - y)$ | $\sum_{v<y}\|R_3(w'-v)\|$ | $\lambda_4^3 \sum_{v<y}\|R_3(w'-v)\|$ |
|---|----|--------|---------------|---------------------------|----------------------------------------|
| 0 | 2  | 0      | $\binom{3}{2}\binom{3}{1}\binom{3}{1}\binom{3}{2} = 81$ | 162 | $(3/8)^3(162) = 8.5$ |
| 1 | 2  | 1      |               |     |     |
| 1 | 2  | 1      |               |     |     |
| 0 | 2  | 2      |               |     |     |

Therefore, the index range of the second candidate $v^{(2)}$ is [4.3,8.5). Additionally, the lower limit on the index range of the third candidate $v^{(3)}$ is 8.5.

The fourth candidate $v^{(4)}=(1,0,0,1)$ is then considered (see Table 4).

TABLE 4

| y | w' | w' − y | $R_3(w' - y)$ | $\sum_{v<y}\|R_3(w'-v)\|$ | $\lambda_4^3 \sum_{v<y}\|R_3(w'-v)\|$ |
|---|----|--------|---------------|---------------------------|----------------------------------------|
| 1 | 2  | 1      | $\binom{3}{1}\binom{3}{2}\binom{3}{2}\binom{3}{1} = 81$ | 243 | $(3/8)^3(243) = 12.8$ |
| 0 | 2  | 2      |               |     |      |
| 0 | 2  | 2      |               |     |      |
| 1 | 2  | 1      |               |     |      |

Therefore, the index range of the third candidate $v^{(3)}$ is [8.5,12.8).

At this point, there is no need to consider the remaining candidates $v^{(5)}$ and $v^{(6)}$. The intermediate message u'=10 lies in the index range corresponding to the third candidate (i.e., u' satisfies 8.5≤u'<12.8). Therefore, the third candidate $v^{(3)}$ is selected as the first column $e_1$ for the 4×4 balanced array E(10), which corresponds to the message u=10. After the first iteration, $$E(10) = \begin{matrix} 0 & \cdots & \cdots & \cdots \\ 1 & \cdots & \cdots & \cdots \\ 1 & \cdots & \cdots & \cdots \\ 0 & \cdots & \cdots & \cdots \end{matrix}$$

The intermediate message u' is updated to u'=int (10−8.5)=1, the index j is incremented to 2, the intermediate row type w' is updated to w'=w'−$e_1$, and another iteration is performed.

For the second iteration, the first, second and third candidates $v^{(1)}$, $v^{(2)}$ and $v^{(3)}$ are considered (see Table 5). The updated intermediate message u' lies in the range [0.6,1.1) corresponding to the second candidate $v^{(2)}$. Therefore, the second candidate $v^{(2)}$ is selected as the second column of the 4×4 balanced array E(10).

Thus, after the second iteration, $$E(10) = \begin{matrix} 0 & 0 & e_{1,3} & e_{1,4} \\ 1 & 1 & e_{2,3} & e_{2,4} \\ 1 & 0 & e_{3,3} & e_{3,4} \\ 0 & 1 & e_{4,3} & e_{4,4} \end{matrix}$$

(A quick examination would indicate that the values for both cells $e_{1,3}$ and $e_{1,4}$ will be 1, and that the values for both cells $e_{2,3}$ and $e_{2,4}$ will be equal to 0.) The intermediate message u' is updated to u'=int (1−0.6)=0, the index j is incremented to 3, the intermediate row type w' is updated to w'=w'−$e_2$, and another iteration is performed.

Since the updated intermediate message u'=0, the candidate corresponding to the first index range having a non-zero upper limit is selected. For the third iteration, the candidates $v^{(1)}$, $v^{(2)}$, $v^{(3)}$, $v^{(4)}$ and $v^{(5)}$ are considered (see Table 6).

The fourth candidate $v^{(4)}$ corresponds to the first index range having a non-zero upper limit. Therefore, the fourth candidate $v^{(4)}$ is selected as the third column $e_3$ for the 4×4 balanced array E(10) corresponding to the message u=10.

TABLE 5

| y | w' | w − y | $R_2(w - y)$ | $\sum_{v<y}|R_3(w'-v)|$ | $\lambda_4^3 \sum_{v<y}|R_3(w'-v)|$ |
|---|---|---|---|---|---|
| 0<br>0<br>1<br>1 | 2<br>1<br>1<br>2 | 2<br>1<br>0<br>1 | $\binom{2}{2}\binom{2}{1}\binom{2}{0}\binom{2}{1} = 4$ | 0 | $(3/8)^2(0) = 0$ |
| 0<br>1<br>0<br>1 | 2<br>1<br>1<br>2 | 2<br>1<br>0<br>1 | $\binom{2}{2}\binom{2}{0}\binom{2}{1}\binom{2}{1} = 4$ | 4 | $(3/8)^2(4) = 0.6$ |
| 0<br>1<br>1<br>0 | 2<br>1<br>1<br>2 | 2<br>0<br>0<br>2 | $\binom{2}{2}\binom{2}{0}\binom{2}{0}\binom{2}{2} = 1$ | 8 | $(3/8)^2(8) = 1.1$ |

TABLE 6

| y | w' | w' − y | $R_1(w' - y)$ | $\sum_{v<y}|R_3(w'-v)|$ | $\lambda_4^3 \sum_{v<y}|R_3(w'-v)|$ |
|---|---|---|---|---|---|
| 0<br>0<br>1<br>1 | 2<br>0<br>1<br>1 | 2<br>0<br>0<br>0 | $\binom{1}{2}\binom{1}{1}\binom{1}{0}\binom{1}{0} = 0$ | 0 | $(3/8)(0) = 0$ |
| 0<br>1<br>0<br>1 | 2<br>0<br>1<br>1 | 2<br>−1<br>1<br>0 | | 0 | $(3/8)(0) = 0$ |
| 0<br>1<br>1<br>0 | 2<br>0<br>1<br>1 | 2<br>−1<br>0<br>1 | | 0 | $(3/8)(0) = 0$ |

TABLE 6-continued

| y | w' | w' − y | $R_1(w'-y)$ | $\sum_{v<y}\|R_3(w'-v)\|$ | $\lambda_4^3 \sum_{v<y}\|R_3(w'-v)\|$ |
|---|---|---|---|---|---|
| 1<br>0<br>0<br>1 | 2<br>0<br>1<br>1 | 1<br>0<br>1<br>0 | $\binom{1}{1}\binom{1}{0}\binom{1}{1}\binom{1}{0}=1$ | 0 | (3/8)(0) = 0 |
| 1<br>0<br>1<br>0 | 2<br>0<br>1<br>1 | 1<br>0<br>0<br>1 | $\binom{1}{1}\binom{1}{0}\binom{1}{0}\binom{1}{1}=1$ | 1 | (3/8)(1) = .375 |

Thus, after the third iteration, $$E(10) = \begin{matrix} 0 & 0 & 1 & e_{1,4} \\ 1 & 1 & 0 & e_{2,4} \\ 1 & 0 & 0 & e_{3,4} \\ 0 & 1 & 1 & e_{4,4} \end{matrix}$$

The updated intermediate message u' is int(0−0)=0, the index j is incremented to 4, the intermediate row type w' is updated to w'=(2,0,1,1)−(1,0,0,1)=(1,0,1,0), and another iteration is performed. Since j=m=4, the last column $e_4$ of the 4×4 balanced array E(10) becomes:

$e_4$=w'=(1,0,1,0).

Thus, $$E(10) = \begin{matrix} 0 & 0 & 1 & 1 \\ 1 & 1 & 0 & 0 \\ 1 & 0 & 0 & 1 \\ 0 & 1 & 1 & 0 \end{matrix}$$

In this manner, the message u=10 is encoded into a 4×4 balanced array E(10). The drive 10 would be configured to write that balanced array E(10) to the optical disc 12.

It would appear that a lookup table could be used to encode each 4-bit message into a 4×4 balanced array. Memory requirements for storing sixteen 4×4 balanced arrays would appear to be quite manageable. For two-dimensional encoding of long messages, however, the lookup table would become too large to be practical. Therefore, the above computations would be performed in order to reduce memory requirements.

Figure 4:
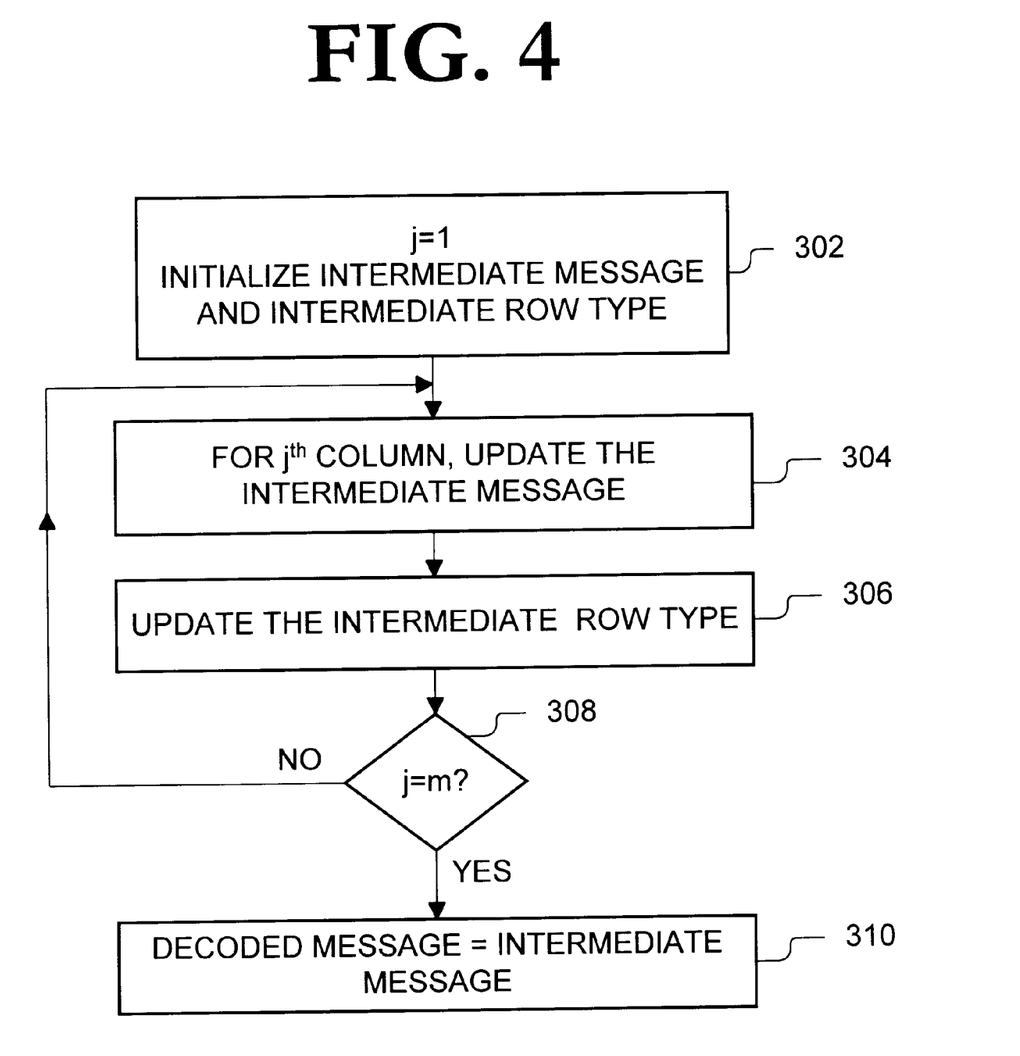
FIG. 4 is a flowchart of a column-wise method for decoding an n×m balanced array in accordance with the present invention.

FIG. 4 shows a column-wise method for decoding a balanced array E(u) into a message u. Decoding is performed essentially by reversing the encoding steps shown in FIG. 3. Given a constrained array E=[$e_1,e_2, \ldots, e_m$] where $e_j$ denotes the columns of the array E, the decoding may be performed as follows. The intermediate message u' is initialized to 0 and the intermediate row type w' is initialized to w, the row type of E (block 302). Starting with column $e_1$, for each column $e_j$, the intermediate message u' is updated to u'=ceiling(u'+$\sigma_L(e_j)$)=⌈u'+$\sigma_L(e_j)$⌉ where the function $\sigma_L(y)$ was defined in equation (4) (block 304). This function gives a lower bound on the number of constrained arrays with initial j−1 columns $e_1, \ldots, e_{j-1}$ and a $j^{th}$ column appearing before $e_j$ in the predetermined ordering. As above, the row type variable w' is updated to w'=w'−$e_j$, after the $j^{th}$ column is processed (block 306). After all m columns have been processed (block 308), the decoded message u is set to the final value of u' (block 310).

The two-dimensional encoding can be carried out in a faster, more computationally efficient manner by performing a bit-wise encoding method instead of the column-wise encoding method described above. The bit-wise encoding method also uses the lexicographic ordering of candidates in which $v^{(i)}<v^{(j)}$ if and only if $v^{(i)}$ is 0 and $v^{(j)}$ is 1 in the first position from the left in which they differ. However, instead of checking each candidate until the index range containing the message is found, the candidate corresponding to the range containing the message (that is, the maximal y belonging to the set of column candidates V satisfying ($\sigma_L(y)\leq u$) is determined in a sequential fashion, one bit at a time.

This bit-wise method uses lower bounds on the number of arrays satisfying the constraint and having previously selected columns $e_1, \ldots, e_{i-1}$ and having $e_{j,1}, \ldots, e_{j,k}$ as the first k entries for the $j^{th}$ column. Let $\mu_{i,k}(e_{j,1}, \ldots, e_{j,k})$ denote this lower bound with the additional dependence on the previous j−1 columns $e_1, \ldots, e_{i-1}$ being implied. Equation (6) below shows how the lower bound $\mu_{i,k}(e_{j,1}, \ldots, e_{j,k})$ is related to the lower bound of equation (4) used in the column-wise encoding procedure. Based on this relationship, for the lexicographic ordering of candidates and for any binary vector y, these lower bounds satisfy $$\sigma_L(y) = \sum_{k:y_k=1} \mu_{j,k}(y_1, \ldots, y_{k-1}, 0),$$

where $\sigma_L(y)$ is the lower index range limit from the column-wise encoding procedure, as defined in equation (5) above and $y_1,y_2, \ldots, y_n$ are the components of y. That is, a lower bound on the number of balanced arrays starting with columns $e_1, \ldots, e_{i-1}$ and having a $j^{th}$ column $e_j$ smaller than y in the lexicographic ordering is given by the sum of the $\mu_{j,k}(y_1, \ldots, y_{k-1}, 0)$ for those k where $y_k$=1. This formula can then be used to determine the $j^{th}$ column $e_j$ of the balanced array E(u), which, from above, is the maximal candidate y (according to the lexicographic ordering) in the set V satisfying $\sigma_L(y))\leq u'$, in a bit-wise fashion in n steps.

Figure 5:
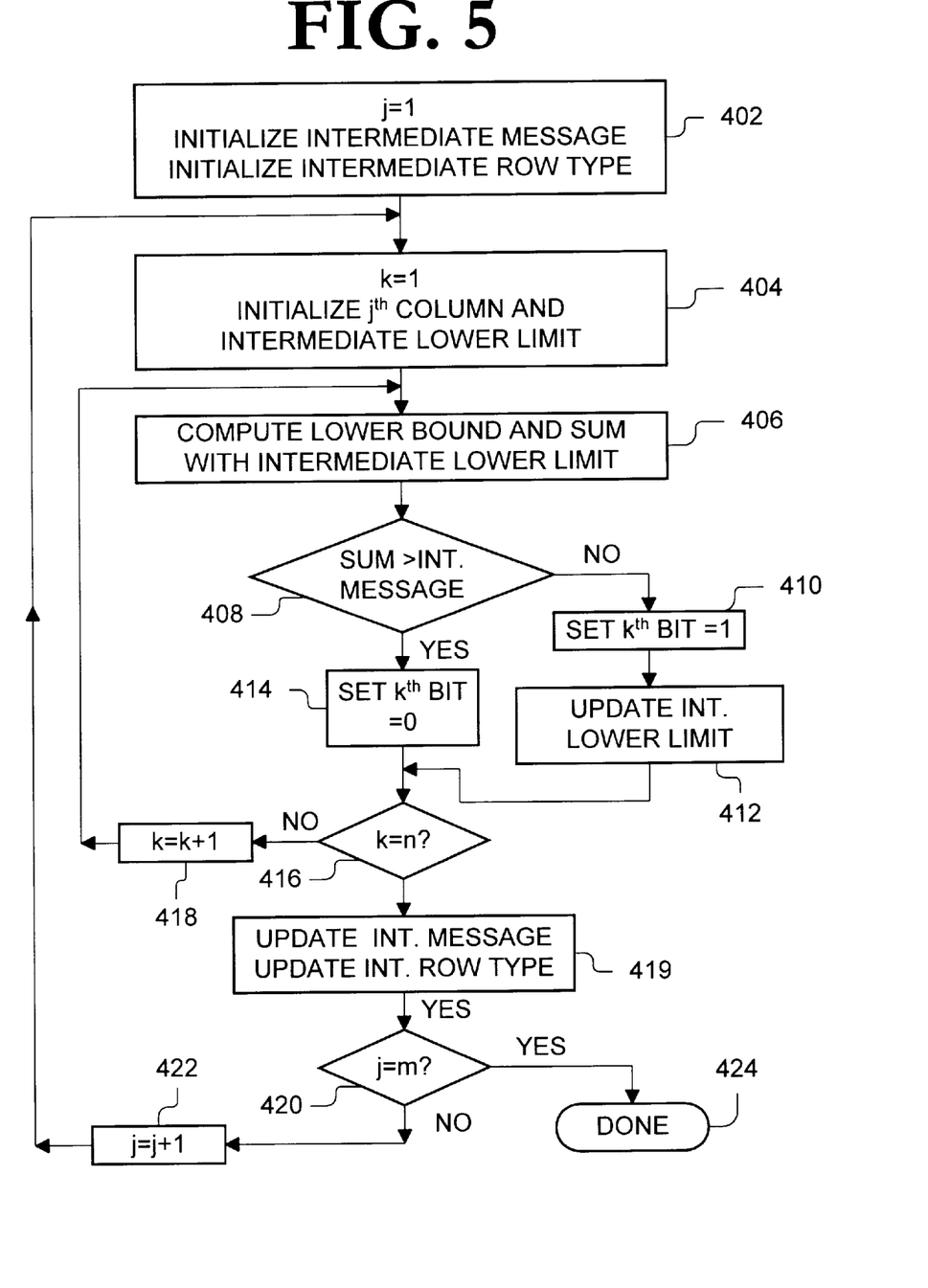
FIG. 5 is a flowchart of a bit-wise method for encoding a message into an n×m balanced array in accordance with the present invention.

Reference is now made to FIG. 5, which illustrates a bit-wise method of encoding a message u into a corresponding balanced array E(u). The column index j is initialized to j=1, the intermediate message is initialized to u'=u and the intermediate row type w' is initialized to w'=w (block 402). A bit index k is initialized to k=1; the $j^{th}$ column $e_j$ of the balanced array E(u) is initialized to $e_j$=(0,0, . . . , 0); and an intermediate lower limit $\sigma'_L$ is initialized to 0 (block 404).

The bits in the $j^{th}$ column $e_j$ are determined sequentially. For each bit $e_{j,k}$ being determined, the lower bound $\mu_{j,k}(e_{j,1}, \ldots, e_{j,k-1},0)$ based on the $j^{th}$ column elements previously selected (i.e., $e_{j,1}$ to $e_{j,k-1}$) and the previous j−1 columns $e_1$ to $e_{j-1}$ is determined (block 406).

Then the intermediate lower limit $\sigma'_L$ and the lower bound $\mu_{j,k}(e_j, \ldots, e_{j,k-1},0)$ are summed together (block 406) and compared to the intermediate message. If the sum of the lower limit $\sigma'_L$ and the lower bound $\mu_{j,k}(e_{j,1}, \ldots, e_{j,k-1}, 0)$ is less than or equal to the intermediate message u' (block 408), then the $k^{th}$ bit $e_{j,k}$ of the $j^{th}$ column $e_j$ is set to $e_{j,k}=1$ (block 410) and the intermediate lower limit $\sigma'_L$ is updated to $\sigma'_L = \sigma'_L + \mu_{j,k}(e_{j,1}, \ldots, e_{j,k-1}, 0)$ (block 412); otherwise the $k^{th}$ bit $e_{j,k}$ is left as $e_{j,k}=0$ (block 414) and $\sigma'_L$ is unchanged. Control is returned to block 406 until all n bits of the $j^{th}$ column $e_j$ have been determined (blocks 416 and 418). The intermediate lower limit $\sigma'_L$, once updated after the $k^{th}$ bit is determined, actually specifies a lower bound on the number of balanced arrays with the first $j-1$ columns equal to the $j-1$ previously selected columns of E(u) and with a $j^{th}$ column appearing before the partially selected $j^{th}$ column of E(u) in the lexicographic ordering of columns.

After all n bits of the $j^{th}$ column $e_j$ have been determined, the intermediate row type w' is updated to w'$-e_j$, and the intermediate message u' is updated to u'=int(u'$-\sigma'_L$) (block 419). If additional columns of the constrained array E(u) have not yet been determined (block 420), the column index j is incremented to j=j+1 (block 422). Control is then returned to block 404, whereby the intermediate lower limit $\sigma'_L$ is reset to 0, the bit index k is set to k=1, and the next column $e_{j+1}$ is determined. This is performed until all m columns of the balanced array E(u) have been determined (block 424).

An alternative formulation of the bit-wise encoding method is as follows. Suppose k-1 bits $e_{j,1}, \ldots, e_{j,k-1}$ of the $j^{th}$ column $e_j$ of the balanced array E(u) have been determined. Then, if u' is smaller than $\mu_{j,k}(e_{j,1}, \ldots, e_{j,k-1}, 0)$, $e_{j,k}$ is set to 0 and otherwise $e_{j,k}$ is set to 1. In a step paralleling the column-by-column technique, the intermediate message u' is unchanged if $e_{j,k}$ was set to 0 and it is updated to u'$-\mu_{j,k}(e_{j,1}, \ldots, e_{j,k-1}, 0)$ if $e_{j,k}$ was set to 1. After the last entry $e_{j,n}$ of the column $e_j$ is determined in this fashion with the corresponding update of the intermediate message, the final intermediate message u' is updated for the next column to int(u'). An alternative encoder which may lead to a different encoding is obtained by updating u' according to int(u'$-\mu_{j,k}(e_{j,1}, \ldots, e_{j,k-1}, 0)$) after each $e_{j,k}$ that is set to 1. The difference is that the int( ) operation is applied after each k instead of only after k=n. These steps can be seen as paralleling the column based technique if 0 and 1, the choices for the next entry of the current column, are identified with the column candidates, and $\mu_{j,k}(e_{j,1}, \ldots, e_{j,k-1}, 0)$ is seen to define the boundary between the index ranges of the two choices. In this bit-wise sequential approach there are only two choices 0 or 1 at each step as opposed to the exponentially many choices for each column in the column-by-column technique.

The bounds $\mu_{j,k}(e_{j,1}, \ldots, e_{j,k-1}, 0)$ may be efficiently computed as follows for the balanced array constraint. In this case, $$\mu_{j,k}(y_1, \ldots, y_k) = \lambda_n^{m-j} \sum_{z: z_i = y_i, i=1 \ldots k} |R_{m-j}(w'-z)|, \quad (6)$$

where the sum is over all balanced binary vectors z equal to $y_1, \ldots, y_k$ in the first k components. Using the expression for $|R_{m-j}(w'-z)|$ from above this can also be expressed as $$\mu_{j,k}(y_1, \ldots, y_k) = \lambda_n^{m-j} \prod_{i=1}^{k} \binom{m-j}{w'_i - y_i} \sum_{z: \|z\| = n/2 - \|y\|} \prod_{i=1}^{n-k} \binom{m-j}{w'_{i+k} - z_i}, \quad (7)$$

where the summation is over n-k dimensional binary vectors $z = z^1, \ldots, z_{l-k}$ satisfying $$\sum_{i=1}^{n-k} z_i = n/2 - \sum_{i=1}^{k} y_i$$

(these sums are respectively denoted by $\|z\|$ and $\|y\|$ in the equation) so that the n-dimensional binary vectors $(y_1, \ldots, y_k, z_1, \ldots, z_{n-k})$ are balanced.

Factoring out $|R_{m-j+1}(w')|$ from the right hand side of equation (7) for $\mu_{j,k}(y_1, \ldots, y_k)$ gives the simpler expression $$\mu_{j,k}(y_1, \ldots, y_k) = \quad (8)$$

$$\lambda_n^{m-j} |R_{m-j+1}(w')| \prod_{i=1}^{k} p_i^{y_i} (1-p_i)^{1-y_i} \sum_{z: \|z\| = n/2 - \|y\|} \prod_{i=1}^{n-k} p_{i+k}^{z_i} (1-p_{i+k})^{1-z_i},$$

where $p_i$ is equal to $w'_i/(m-j+1)$. Thus, the value $\mu_{j,k}(y_1, \ldots, y_k)$ can be written as the product of four terms:

$$\lambda_m^{m-1}, |R_{m-j+1}(w')|, \prod_{i=1}^{k} p_i^{y_i}(1-p_i)^{1-y_i},$$

and $$\sum_{z: \|z\| = n/2 - \|y\|} \prod_{i=1}^{n-k} p_{i+k}^{z_i}(1 - p_{i+k})^{1-z_i}.$$

The first three terms can be computed efficiently directly from their definitions while the fourth term is equal to the coefficient of $x^{n/2-\|y\|}$ in the polynomial $$P_{j,k}(x) = \prod_{i=1}^{n-k} [1 - p_{i+k} + xp_{i+k}].$$

The coefficient of $x^h$ in this polynomial will be denoted by $S_{j,k,h}$. Thus the fourth term is equal to $S_{j,k,(n/2-\|y\|)}$.

An example will now be provided in conjunction with the above encoding of the message u=10 into a corresponding 4×4 balanced array E(10). The column index j is initialized to j=1, the intermediate message u' is initialized to 10, the intermediate row type w' is initialized to (2,2,2,2), and the first column $e_1$ of the corresponding balanced array E(10) is determined as follows.

First, the bit variable k is initialized to k=1, and the first column $e_1$ of the array E(u) is initialized to $e_1$=(0,0,0,0). The intermediate lower bound $\sigma'_L$ is initialized to 0.

Then $\mu_{1,1}(0)$ is determined. Since w'=w=(2,2,2,2), $p_1$=2/(4)=½. Also n/2$-\|0\|$=4/2$-$0=2. Then, from equation (8), $\mu_{1,1}(0)$ is equal to $\mu_{1,1}(0) = \lambda_4^3 |R_4(2,2,2,2)|(½)S_{1,1,2}$. The quantity $\lambda_4$ was already determined to be ⅜ and $R_4(2,2,2,2)$ was determined to be 64. The term $S_{1,1,2}$ is computed by determining the coefficient of $x^2$ in the polynomial $P_{1,1}(x) = (1-p_2+xp_2)(1-p_3+xp_3)(1-p_4+xp_4) = (½+x/2)^3$. The polynomial $P_{1,1}(x)$ is equal to ⅛(1+x)(1+2x+x²)=⅛(1+3x+3x²+x³). Thus $S_{1,1,2}$=⅜, and therefore $\mu_{1,1}(0) = (⅜)^3 6^4(½)(⅜) = (⅜)^3$ (243) which is about 12.8. Since $\sigma'_L+12.8>10$, $e_{1,1}$ (that is, the first entry of the candidate column) is left unchanged at 0.

The variable k is incremented to k=2 and the next step is performed to determine $\mu_{1,2}(0,0)$. The quantity $n/2-\|0,\|0$ is still equal to 2. Again from equation (8), $\mu_{1,2}(0,0)$ is set to $\mu_{1,2}(00)=\lambda_4^3|R_4(2,2,2,2)|(\frac{1}{2})(\frac{1}{2})S_{1,2,2}$ is the coefficient of $x^2$ in the polynomial $P_{1,2}(x)=(\frac{1}{2}+x/2)^2$. The polynomial $P_{1,2}(x)$ is equal to $\frac{1}{4}(1+2x+x^2)$. Thus $S_{1,2,2}$ is equal to $\frac{1}{4}$, and $\mu_{1,2}(0,0)=(\frac{3}{8})^36^4(\frac{1}{2})^2(\frac{1}{4})=(\frac{3}{8})^3(81)$ which is about 4.3. Since $\sigma'_L+4.3=4.3\leq 10$, the second entry $e_{1,2}$ of the first column is changed to $e_{1,2}=1$, and $\sigma_L$ is now 4.3.

The variable k is incremented to 3 and the next step is to determine $\mu_{1,3}(0,1,0)$. This time $n/2-\|0,1,0\|$ is equal to 1 since $\|0,1,0\|=1$. Again from equation (8), $\mu 1,3(0,1,0)$ is equal to $\mu_{1,3}(0,1,0)=\lambda_4^3|R_4(2,2,2,2)|(\frac{1}{2})^3S_{1,3,1}$, where this time $S_{1,3,1}$ is the coefficient of x in the polynomial $P_{1,3}(x)=(\frac{1}{2}+x/2)^3$. Thus $S_{1,3,1}$ is equal to $\frac{1}{2}$ and $\mu_{1,3}(0,1,0)=(\frac{3}{8})^36^4(\frac{1}{2})^3(\frac{1}{2})=(\frac{3}{8})^3(81)$ which again is about 4.3. Since $\sigma'_L+4.3=8.6\leq 10$, the third element $e_{1,3}$ of the first column is changed to $e_{1,3}=1$, and $\sigma'_L$ is now 8.6.

The variable k is incremented to k=4 and the final step is to determine $\mu_{1,4}(0,1,1,0)$. This time $n/2-\|0,1,1,0\|=0$. From equation (8), $\mu_{1,4}(0,1,1,0)$ is equal to $\mu_{1,4}(0,1,1,0)=\lambda_4^3|R_4(2,2,2,2)|(\frac{1}{2})^4S_{1,4,0}$ where $S_{1,4,0}$ is the coefficient of $x^0$ or the constant term of the polynomial $P_{1,4}(x)=1$. Thus $S_{1,4,0}$ is equal to 1 and $\mu_{1,4}(0,1,1,0)=(\frac{3}{8})^36^4(\frac{1}{2})^4=(\frac{3}{8})^3(81)$ which again is about 4.3. Since $\sigma'_L+4.3=12.9>10$, the fourth element $y_4$ of the candidate y is left unchanged at $y_4=0$ (as is expected, since 0,1,1,1 would not be a balanced column), and $\sigma'_L$ remains about 8.6.

Thus the first column $e_1$ of the balanced array E(10) was determined in a bit-wise fashion to be $e_1=(0,1,1,0)$, precisely the same value obtained by the column-wise method. Before the second column $e_2$ of the balanced array E(10) is determined in the same bit-wise manner, the column index j is incremented to j=2, the intermediate row type w' is updated to $w'=w'-e_1$, and the intermediate message u' is updated to $u'=int(10-\sigma'_L)=1$. The bit-wise procedure is then repeated with the new variables for the second column $e_2$, and so on until all of the other columns $e_3$ and $e_4$ of the balanced array E(10) have been determined.

Both the column-wise and bit-wise encoding procedures (and the specified variations) described above are one-to-one (and hence decodable) in the sense that any two distinct messages $u_1 \neq u_2$ in the range determined during initialization are encoded into distinct balanced arrays $E(u_1) \neq E(u_2)$. It is a non-trivial property of the lower bounds on the cardinalities of sets of balanced arrays with partially specified entries that are used in each iteration, that the resulting encoding is one-to-one. If instead of lower bounds, the exact cardinalities were used, the decodability would follow from the classical enumerative coding technique, upon which the above techniques are based. In the case of the balanced array constraint, however, the applicants are not aware of an efficient technique for computing the exact cardinalities involved. Therefore a direct application of the classical enumerative coding technique is believed to be impractical. A key aspect of the present invention is the fact that the exact cardinalities in the classical enumerative coding technique can be replaced by the above polynomial-time computable (as demonstrated by the bit-wise technique) lower bounds, and still obtain a one-to-one encoding with very low redundancy. This point also applies to the computational complexity of decoding, as described below.

Figure 6:
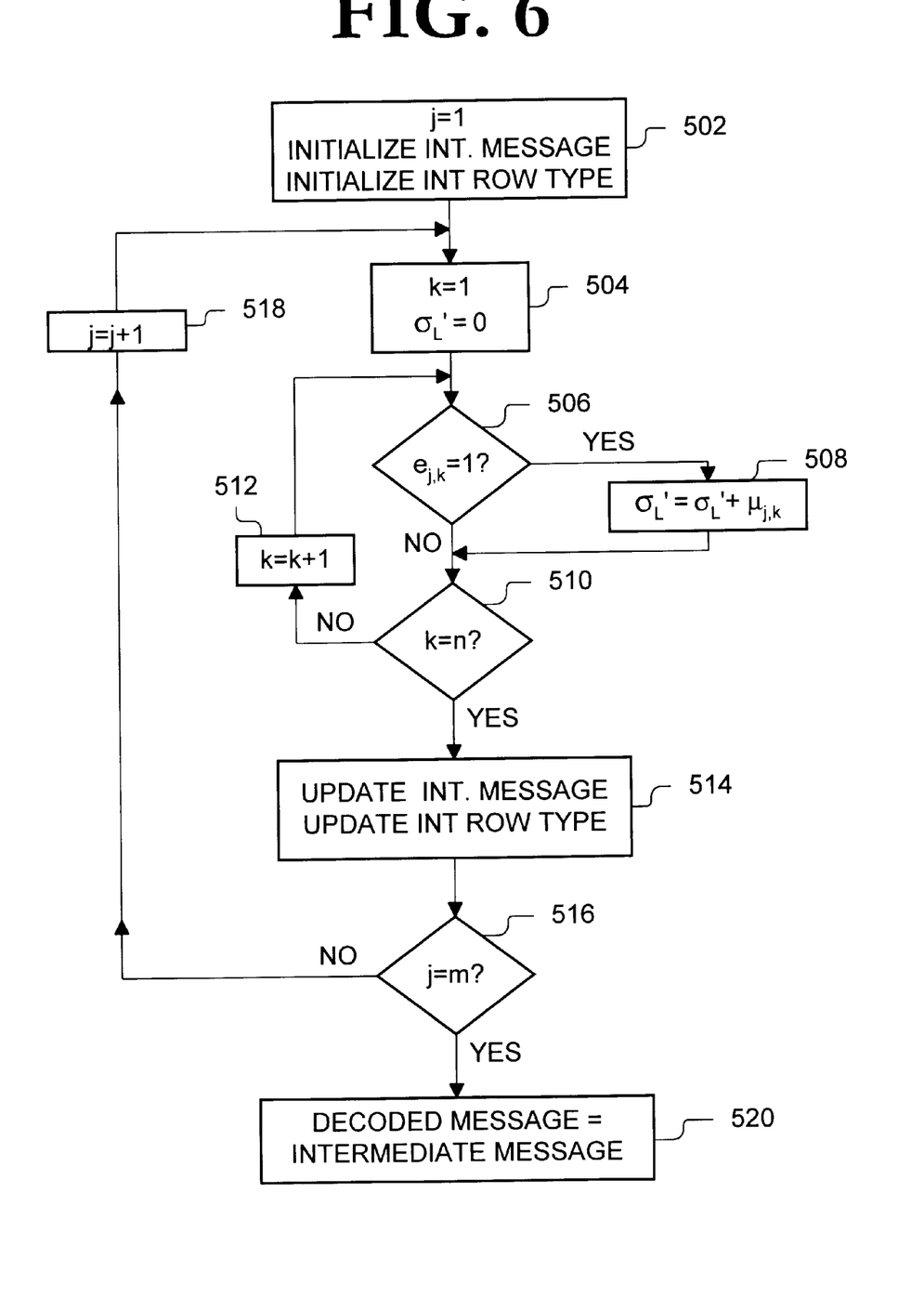
FIG. 6 is a flowchart of a bit-wise method for decoding an n×m balanced array in accordance with the present invention.

FIG. 6 shows a method for the bit-wise decoding of a balanced array into a message. Decoding is performed essentially by reversing the encoding steps shown in FIG. 5. The constrained array E is processed one column at a time, starting with the first column and updating the intermediate variables u' and w' after each column. The decoded message u is set to the final value of u' obtained after the last column of E has been processed.

The decoding is performed as follows. The intermediate message variable u' is initialized to 0, the intermediate row type variable w' is initialized to w, and j the column index is initialized to j=1 (block 502). Assume j−1 columns have already been processed and $\sigma'_L$ is initialized to 0 at the start of the processing of the $j^{th}$ column (block 504). Each entry $e_{j,k}$ of the $j^{th}$ column is examined starting with the first entry (k=1) and if $e_{j,k}=1$ (block 506), the intermediate variable ($\sigma'_L$ is updated to $\sigma'_L=\sigma'_L+\mu_{j,k}(e_{j,1},\ldots,e_{j,k-1},0)$ (block 508). If $e_{j,k}=0$, the intermediate variable $\sigma'_L$ is left unchanged. After the last entry (k=n) of the $j^{th}$ column has been processed in this fashion (blocks 510 and 512), the intermediate message u' is updated as $u'=u'+ceiling(\sigma'_L)$ and the intermediate row type w' is updated to $w'=w'-e_j$ (block 514). In preparation for the next column (block 516), the column index j is incremented by 1 (block 518) and control is returned to block 504, whereby $\sigma'_L$ is reset to 0, and k is reset to k=1. After the last column has been processed (block 516), the decoded message u is set to the intermediate message u' (block 520).

In an alternative implementation $\sigma'_L$ can be replaced by u' in the above operations and the corresponding final updating of u' at the end of each column can be replaced by u'=ceiling (u'). If, during encoding u' is updated to $int(u'-\mu_{j,k}(e_{j,1},\ldots,e_{j,k-1},0))$ each time $e_{j,k}$ was set to 1, the corresponding alternative decoder would update u' to $u'+ceiling(\mu_{j,k}(e_{j,1},\ldots,e_{j,k-1},0))$ for each k where the column entry $e_{j,k}$ is 1. For this alternative encoder/decoder pair (which, as noted above, may yield a different mapping between messages and constrained arrays) the intermediate message u' is always an integer and the intermediate lower limit $\sigma'_L$ is not needed.

Figure 7A:
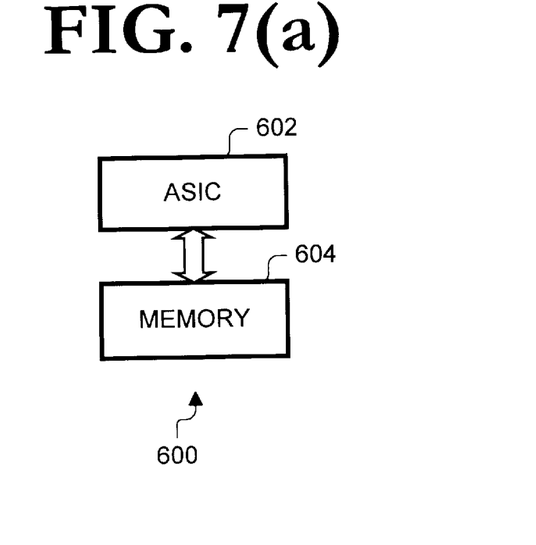
FIGS. 7(a) and 7(b) are illustrations of possible hardware implementations for the methods in accordance with the present invention.
Figure 7B:
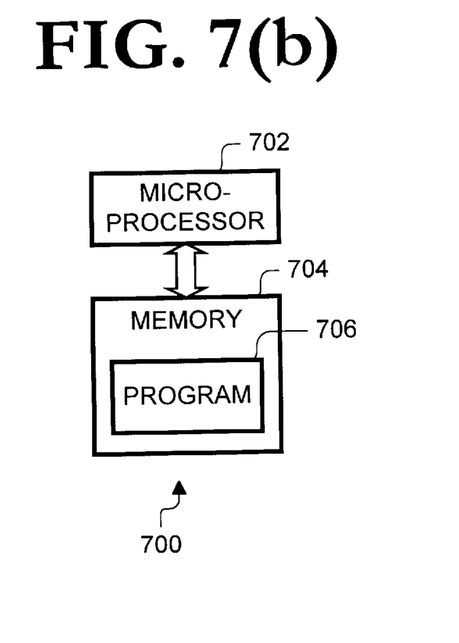

FIGS. 7(a) and 7(b) show two possible hardware implementations 600 and 700 for the encoding and decoding methods described above. FIG. 7(a) shows an implementation 600 including an application specific integrated circuit ("ASIC") 602 and off-chip memory 604 for performing the encoding or decoding in accordance with either the bit-wise or column-wise method above. FIG. 7b shows a microprocessor 702 and memory 704 (e.g., collectively long-term memory such as a hard drive and short-term memory such as DRAM) for storing a program 706. The program 706 instructs the microprocessor 702 to perform the encoding or decoding in accordance with either the bit-wise or column-wise method above. The microprocessor 702 and memory 704 could be part of a machine such as a personal computer or workstation.

Thus disclosed is an encoder that encodes messages into n×m constrained arrays, and a decoder that decodes n×m constrained arrays into messages. The constrained arrays may be balanced and, therefore, dc free. Redundancy of encoding is lower than previously reported. As a consequence of reducing the redundancy, a higher density of messages can be packed into an n×m array. This, in turn, allows the size of the balanced array to be reduced which, in turn, allows more data to be stored on a recordable medium.

Enumerative coding techniques may be used to ease computational and memory requirements. At each iteration of encoding, a range of available arrays is determined. There is no need to determine the exact number of balanced arrays. This is especially valuable for the coding of large messages. The use of a polynomial equation to find the lower limit of the index ranges further eases the computational requirements and increases computational speed. Moreover, the encoding doesn't go down a trail that runs out of arrays.

Although the invention was described above in connection with a drive that writes to a recordable medium such as an optical disk, it is not so limited. The invention could be applied to other devices including, but not limited to, hard drives and holographic storage devices. Moreover, the invention could be applied to other types of recordable media, such as read-only media.

The invention is not limited to the specific embodiments described and illustrated above. For example, the coding method is not limited to balanced arrays (i.e., even numbers of 1's and 0's). The vector w can specify row types having any desired number of 1's in the rows. Non-integer indices may be used instead of integer indices. The terms rows and columns may be used interchangeably through transposition. A minimal candidate y that satisfies $\sigma_L(y) \leq u$ could be used instead of the maximal candidate y.

Accordingly, the invention is not limited to the specific embodiments described and illustrated above. Instead, the invention is construed according to the claims that follow.

What is claimed is:

1. A method of encoding a message into a corresponding array for storage on a data storage medium, the corresponding array being an element of a constrained array set, the method comprising:

a) considering a predetermined ordering of candidates for a $j^{th}$ column of the corresponding array, where j is a positive integer;

b) for each candidate being considered, computing a lower bound on the number of constrained arrays having that candidate as the $j^{th}$ column and also having previously selected columns of the corresponding array as the first j-1 columns;

c) determining an index range for each candidate being considered, upper and lower limits of each index range being based upon the lower bounds of the candidates being considered;

d) determining the range in which an intermediate message lies; and e) selecting a candidate corresponding to the determined range as the $j^{th}$ column of the corresponding array.

2. The method of claim 1, wherein the upper limit of the index range for a candidate being considered is equal to the lower limit of the index range plus the lower bound of the candidate being considered.

3. The method of claim 1, wherein the lower bound is also determined as a function of an intermediate row type.

4. The method of claim 3, wherein the lower bound for a candidate y is computed as $\lambda_n^{m-j}|R_{m-j}(w'-y)|$.

5. The method of claim 3, wherein the range in which the intermediate message lies is computed as the largest candidate in the predetermined ordering to satisfy $\sigma_L(y) \leq u'$, where y is the candidate, $\sigma_L(y)$ is the lower limit of the index range of candidate and u' is the intermediate message.

6. The method of claim 5, wherein the lower limit of the index range $\sigma_L(y)$ of candidate y is determined as $$\sigma_L(y) = \lambda_n^{m-j} \sum_{v<y} |R_{m-j}(w'-v)|$$

where the sum is over candidates v preceding the candidate y in the predetermined ordering.

7. The method of claim 3, further comprising:

(f) updating the intermediate message by subtracting the lower limit of the selected candidate from the intermediate message;

(g) updating the intermediate row type by determining the row type of the yet-to-be-selected portion of the corresponding array;

(h) updating j;

(i) returning to step (a) at least one time; and (j) writing the corresponding array to the medium after the encoding has been finished.

8. The method of claim 1, wherein the candidates are lexicographically ordered.

9. A method of decoding an array into a decoded message, the array being stored on a storage medium, the array being an element of a constrained array set, the method comprising:

a) reading the array from the medium;

b) initializing an intermediate message;

c) considering a predetermined ordering of candidate columns for each column of the array;

d) for a $j^{th}$ column of the array, updating the intermediate message by adding to it a lower limit, the lower limit being based on a lower bound of the $j^{th}$ column, the lower bound being a bound on the number of constrained arrays of the constrained array set having the first j-1 columns equal to the first j-1 columns of the array being decoded and a $j^{th}$ column appearing before the $j^{th}$ column of the array in the predetermined ordering; and e) setting the decoded message to the intermediate message after all columns of the array have been processed.

10. The method of claim 9, wherein the lower limit $\sigma_L(y)$ of candidate y is determined as $$\sigma_L(y) = \lambda_n^{m-j} \sum_{v<y} |R_{m-j}(w'-v)|$$

where the sum is over candidates v preceding the candidate y in the predetermined ordering.

11. A method of encoding a message into a corresponding array for storage on a data storage medium, the corresponding array having m columns and being an element of a constrained array set, the method comprising:

(a) determining a lower bound on the number of constrained arrays having a 0 as the $k^{th}$ bit of the $j^{th}$ column, having the first k-1 bits of the $j^{th}$ column equal to previously selected bits of the $j^{th}$ column, and also having the first j-1 columns equal to previously selected entries of the corresponding array, where k and j are positive integers and $0 < j \leq m$; and (b) setting the value of the $k^{th}$ bit of the corresponding array depending upon the value of the lower bound relative to an intermediate message;

steps (a) and (b) being performed for each bit in the $j^{th}$ column.

12. The method of claim 11, wherein a lower bound for the $k^{th}$ bit in the $j^{th}$ column is computed and added to an intermediate lower limit for the $j^{th}$ column, wherein the intermediate message is compared to the sum of the lower bound and the intermediate lower limit; wherein the lower limit is updated and the $k^{th}$ bit is set to 0 if the sum is greater than the intermediate message; and wherein the lower limit is left unchanged and the $k^{th}$ bit is set to 1 if the sum is not greater than the intermediate message.

13. The method of claim 12, wherein the intermediate message is updated by subtracting the lower bound of the $k^{th}$ bit from the intermediate message.

14. The method of claim 13, wherein the intermediate message is updated immediately after a $k^{th}$ bit is determined.

15. The method of claim 13, wherein the intermediate message is updated immediately after a $j^{th}$ column is determined.

16. The method of claim 12, wherein the lower bound $\mu_{j,k}$ is computed as $$\mu_{j,k}(y_1, \ldots, y_k) = \lambda_n^{m-j} \sum_{z: z_i = y_i, i=1\ldots k} |R_{m-j}(w' - z)|,$$

where $y_1, \ldots, y_{k-1}$ are set equal to the previously selected $k-1$ bits of the $j^{th}$ column and $y_k$ is set to 0.

17. The method of claim 12, wherein a polynomial equation is used to compute the lower bound.

18. The method of claim 17, wherein the polynomial equation is $$P_{j,k}(x) = \prod_{i=1}^{n-k} [1 - p_{i+k} + xp_{i+k}].$$

19. The method of claim 18, wherein a fourth factor of the lower bound $$\mu_{j,k}(y_1, \ldots, y_k) =$$

$$\lambda_n^{m-j} |R_{m-j+1}(w')| \prod_{i=1}^{k} p_i^{y_i}(1-p_i)^{1-y_i} \sum_{z: \|z\| = n/2 - \|y\|} \prod_{i=1}^{n-k} p_{i+k}^{z_i}(1-p_{i+k})^{1-z_i}$$

is computed by determining the coefficient of $x^{n/2 - \|y\|}$ in the polynomial equation $P_{j,k}(x)$.

20. The method of claim 11, wherein the encoding is performed for all n bits in each column; and wherein the corresponding array is written to the medium after the last column has been encoded.

21. A method of decoding an array into a decoded message, the array being stored on a storage medium, the array being an element of a constrained array set, the method comprising:
(a) reading the array from the medium;
(b) considering each column of the array, for each column being considered, initializing an intermediate message and an intermediate lower limit, and then updating the intermediate lower limit for each bit that equals 1;
(c) updating the intermediate message with the intermediate lower limit no later than after all of the bits in the column being considered have been processed; and
(d) setting the decoded message equal to the intermediate message after all of the columns of the array have been considered.

22. The method of claim 21, wherein the intermediate message is updated by adding the intermediate lower limit to the intermediate message.

23. The method of claim 21, wherein the intermediate lower limit is updated by computing a lower bound corresponding to a bit equaling one and adding the lower bound to the intermediate lower limit.

24. The method of claim 23, wherein the lower bound $\mu_{j,k}(y_1, \ldots, y_k)$ that is added to the intermediate message because a $k^{th}$ bit equals 1 is computed as $$\mu_{j,k}(y_1, \ldots, y_k) = \lambda_n^{m-j} \sum_{z: z_i = y_i, i=1\ldots k} |R_{m-j}(w' - z)|,$$

where $y_1, \ldots, y_{k-1}$ are set equal to the previous $k-1$ bits of the $j^{th}$ column and $y_k$ is set to 0.

25. The method of claim 23, wherein a polynomial equation is used to compute the lower bound.

26. The method of claim 25, wherein the polynomial equation is $$P_{j,k}(x) = \prod_{i=1}^{n-k} [1 - p_{i+k} + xp_{i+k}].$$

27. The method of claim 26, wherein a fourth factor of the lower bound $$\mu_{j,k}(y_1, \ldots, y_k) =$$

$$\lambda_n^{m-j} |R_{m-j+1}(w')| \prod_{i=1}^{k} p_i^{y_i}(1-p_i)^{1-y_i} \sum_{z: \|z\| = n/2 - \|y\|} \prod_{i=1}^{n-k} p_{i+k}^{z_i}(1-p_{i+k})^{1-z_i}$$

is computed by determining the coefficient of $x^{n/2 - \|y\|}$ in the polynomial equation $P_{j,k}(x)$.

28. Apparatus for encoding a message into an array for storage on a data storage medium, the array being an element of a constrained array set, the apparatus comprising:
first means for filling entries in the array with candidates having a predetermined ordering, the first means filling an entry by determining a lower limit of each candidate being considered for that entry, the lower limit being a sum of lower bounds of preceding candidates, where the preceding candidates precede the candidate being considered in the predetermined ordering, each lower bound representing a number of set elements having as corresponding entries the candidate being considered and previously filled entries of the array; and
second means for computing an intermediate message based on the lower limits and the message being encoded;
the first means filling an entry with a candidate by comparing the lower limit of that candidate relative to the intermediate message.

29. The apparatus of claim 28, wherein the entries are columns, and wherein the first means determines a lower bound from a $j^{th}$ column candidate and any previously selected columns of the array as the first to $j-1$ th columns, where j is a positive integer, whereby column-wise encoding is performed.

30. The apparatus of claim 29, wherein the first means fills a column by determining an index range for each column candidate being considered, upper and lower limits of each index range being based upon the lower bound of the candidate being considered and the lower bounds of the preceding candidates; determining the range in which the intermediate message lies; and filling the column with the candidate corresponding to the determined range.

31. The apparatus of claim 30, wherein the range in which the intermediate message lies is computed as the largest candidate in the predetermined ordering to satisfy $\sigma_L(y) \leq u'$, where y is the candidate, $\sigma_L(y)$ is the lower limit of the index range of candidate, and u' is the intermediate message.

32. The apparatus of claim 31, wherein the lower limit of the index range $\sigma_L(y)$ of candidate y is determined as $$\sigma_L(y) = \lambda_n^{m-j} \sum_{v < y} |R_{m-j}(w' - v)|$$

where v is a candidate preceding the candidate y in the predetermined ordering.

33. The apparatus of claim 28, wherein the entries are bits, and wherein the first means determines for a $k^{th}$ bit of a $j^{th}$ column a lower bound on a number of constrained set elements including the previously selected k−1 bits of the $j^{th}$ column, and the previously selected j−1 columns of the corresponding array, where k and j are positive integers, whereby bit-wise encoding is performed.

34. The apparatus of claim 33, wherein the first means computes a lower bound for a $k^{th}$ bit of a $j^{th}$ column, adds the lower bound of the $k^{th}$ bit to an intermediate lower limit of the $j^{th}$ column, and compares the intermediate message to the sum of the lower bound and the intermediate lower limit, the $k^{th}$ bit being set to 0 if the sum is greater than the intermediate message, the $k^{th}$ bit being set to 1 if the sum is not greater than the intermediate message.

35. The apparatus of claim 33, wherein the second means updates the intermediate message by subtracting the lower bound from the intermediate message.

36. The apparatus of claim 35, wherein the lower bound $\mu_{j,k}(y_1, \ldots, y_k)$ that is subtracted from the intermediate message is computed as $$\mu_{j,k}(y_1, \ldots, y_k) = \lambda_n^{m-j} \sum_{z: z_i = y_i, i=1 \ldots k} |R_{m-j}(w' - z)|,$$

where $y_1, \ldots, y_{k-1}$ are set equal to the previously selected k−1 bits of the $j^{th}$ column and $y_k$ is set to 0.

37. The apparatus of claim 35, wherein a polynomial equation is used to compute the lower bound.

38. The apparatus of claim 37, wherein the polynomial equation is $$P_{j,k}(x) = \prod_{i=1}^{n-k} [1 - p_{i+k} + x p_{i+k}].$$

39. The apparatus of claim 38, wherein a fourth factor of the lower bound $$\mu_{j,k}(y_1, \ldots, y_k) =$$

$$\lambda_n^{m-j} |R_{m-j+1}(w')| \prod_{i=1}^{k} p_i^{y_i}(1-p_i)^{1-y_i} \sum_{z: ||z|| = n/2 - ||y||} \prod_{i=1}^{n-k} p_{i+k}^{z_i}(1-p_{i+k})^{1-z_i}$$

is computed by determining the coefficient of $x^{n/2 - ||y||}$ in the polynomial equation $P_{j,k}(x)$.

40. Apparatus for decoding an array into a decoded message, the array being an element of a constrained array set, the apparatus comprising:

first means for initializing an intermediate message;

second means for considering a predetermined ordering of candidate columns for each column of the array, for each column being considered the second means updating the intermediate message by adding a lower limit of the column being considered, the lower limit being a sum of lower bounds of candidates preceding the column being considered in the predetermined ordering, each lower bound representing a number of constrained arrays including both the candidate being considered and previously selected candidates of the array; and third means for setting the decoded message equal to the intermediate message after all columns of the array have been considered.

41. Apparatus for decoding an array into a decoded message, the array being an element of a constrained array set, the apparatus comprising:

means for initializing an intermediate message;

means for considering each column of the array, each column being considered by examining each bit, updating an intermediate lower limit for each bit that is equal to 1, and updating the intermediate message after examination of all of the bits in the column being considered, the intermediate message being updated with the intermediate lower limit;

means for initializing the intermediate lower limit before a column of the array is considered; and means for setting the decoded message equal to the intermediate message after all of the columns of the array have been considered.

42. An article of manufacture for a microprocessor, the article comprising:

computer memory; and a program encoded in the computer memory, the program, when executed, instructing the microprocessor to encode a message into an array by filling entries in the array with candidates having a predetermined ordering, the array being an element of a constrained array set;

the instructions causing the microprocessor to fill an entry by determining a lower limit of each candidate being considered for that entry, the lower limit being a sum of lower bounds of preceding candidates, where the preceding candidates precede the candidate being considered in the predetermined ordering, each lower bound representing a number of set elements including both the candidate being considered and previously filled entries of the array;

an intermediate message being based on the lower limits and the message being encoded;

an entry being filled with a candidate as a result of a comparison of the lower limit of that candidate relative to the intermediate message.

43. The article of claim 42, wherein the lower bound is determined only from a candidate and any previously selected columns of the corresponding array.

44. The article of claim 42, wherein the lower bound is determined from a $k^{th}$ bit of a $j^{th}$ column, the previously selected k−1 bits of the $j^{th}$ column, and the previously selected j−1 columns of the corresponding array, where k and j are positive integers.

* * * * *